(12) United States Patent
von der Waydbrink et al.

(10) Patent No.: US 8,821,977 B2
(45) Date of Patent: *Sep. 2, 2014

(54) TRANSPORTING DEVICE, IN PARTICULAR FOR TRANSPORTING SHEET-LIKE SUBSTRATES THROUGH A COATING INSTALLATION

(75) Inventors: Hubertus von der Waydbrink, Dresden (DE); Georg Laimer, Meissen (DE); Siegfried Scheibe, Dresden (DE); Ricky C. Powell, Ann Arbor, MI (US); James Ernest Hinkle, Lambertville, MI (US); James B. Foote, Toledo, OH (US)

(73) Assignee: First Solar, Inc., Perrysburg, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/606,050

(22) Filed: Sep. 7, 2012

(65) Prior Publication Data

US 2013/0056333 A1 Mar. 7, 2013

Related U.S. Application Data

(63) Continuation of application No. 11/918,009, filed as application No. PCT/EP2006/003166 on Apr. 7, 2006, now Pat. No. 8,277,890.

(30) Foreign Application Priority Data

Apr. 8, 2005 (DE) .......................... 10 2005 016 407
Mar. 10, 2006 (DE) .......................... 10 2006 011 517

(51) Int. Cl.
*C23C 16/00* (2006.01)
*B05C 13/00* (2006.01)

(52) U.S. Cl.
USPC ..................................... 427/255.23; 118/500

(58) Field of Classification Search
USPC ............. 198/781.01–781.05, 370.07, 370.08, 198/370, 779, 781, 785, 786; 193/11, 35 R; 118/500, 718, 719; 427/255.5, 255.23, 427/248.1; 204/298.11, 298.16, 298.23, 204/298.35, 298.29
See application file for complete search history.

(56) References Cited

U.S. PATENT DOCUMENTS

| | | | |
|---|---|---|---|
| 3,724,642 A | | 4/1973 | De Good |
| 4,429,866 A | | 2/1984 | Castro-Hahn |
| 4,553,931 A | | 11/1985 | Wachi et al. |
| 4,632,688 A | | 12/1986 | Rahrig et al. |
| 4,728,353 A | | 3/1988 | Thomas et al. |
| 4,976,766 A | | 12/1990 | Kuster et al. |
| 5,123,522 A | * | 6/1992 | Comly, Jr. ..................... 198/779 |
| 5,168,310 A | | 12/1992 | Hayashi et al. |
| 6,772,874 B2 | * | 8/2004 | Yamashita et al. ....... 198/781.03 |
| 7,367,264 B2 | | 5/2008 | Beaudry |
| 7,866,460 B2 | | 1/2011 | Hentschel et al. |
| 8,277,890 B2 | * | 10/2012 | Von Der Waydbrink et al. ........................ 427/255.23 |

FOREIGN PATENT DOCUMENTS

| | | |
|---|---|---|
| DE | OS 1 802 544 | 5/1970 |
| DE | 36 37 759 | 5/1987 |
| DE | 38 20 616 A1 | 12/1989 |
| DE | 195 24 562 A1 | 1/1997 |
| DE | 197 18 769 | 11/1998 |
| WO | WO 93/23881 A | 11/1993 |

* cited by examiner

*Primary Examiner* — Scott Kastler
*Assistant Examiner* — Michael Aboagye
(74) *Attorney, Agent, or Firm* — Dickstein Shapiro LLP

(57) ABSTRACT

A transport device and method of transporting a substrate using a rotatable shaft and baffles may be used to extend cleaning intervals for the transport device and reduce deposition of a vapor deposition material upon the transport device.

20 Claims, 3 Drawing Sheets

TRANSPORTING DEVICE, IN PARTICULAR FOR TRANSPORTING SHEET-LIKE SUBSTRATES THROUGH A COATING INSTALLATION

This application is a continuation of and claims priority to U.S. patent application Ser. No. 11/918,009, now issued as U.S. Pat. No. 8,277,890, filed Oct. 5, 2007, the entirety of which is incorporated by reference herein, which claims priority under 35 U.S.C. §371 to International Application No. PCT/EP2006/003166, filed on Apr. 7, 2006, which claims priority to German Patent Application Serial No. 10 2006 011 517.1, filed Mar. 10, 2006 and German Patent Application Serial No. 10 2005 016 407.2, filed Apr. 8, 2005, each of which is incorporated by reference in its entirety.

The invention relates to a transporting device, in particular for transporting sheet-like substrates through a coating installation.

BACKGROUND

For transporting substrates through coating installations, various types of transporting devices are known. Such transporting devices often comprise a plurality of transporting rollers.

SUMMARY

A transporting device for transporting sheet-like substrates through a coating installation, can include transporting rollers rotatably mounted on both sides and horizontally arranged transversely in relation to a transporting direction, the rollers having uppermost surface lines defining a transporting plane, the rollers having end parts that have a smaller diameter than the middle part of the transporting rollers.

In one aspect, a transporting device can include a roller that is protected by a shield or baffles. The baffles configured to be mounted displaceably in an axial direction of the transporting rollers between a first position and a second position, the baffles arranged between the end parts of the transporting rollers and the transporting plane. A shield can have the form of a collector ribbon, a parallel foil loop, a transverse foil loop, a roll-to-roll cassette, or a rotatable horizontal disc. A roller can also contain a heating element to minimize deposition on the roller.

In another aspect, a transporting device can include a back-up roller. The back-up roller can be configured to support a roller such as a bridge roller. The back-up roller can be positioned in a lower region and the roller can be positioned on a surface region. So long as the diameter of a back-up roller remains largely unchanged, the surface speed of the bridge roller can remain fixed, thereby maintaining the efficiency of the system. A back-up roller can include a guidance element. An on-axis guide pin can also fix the axial position of the bridge roller if the bridge roller is solid, or has an end cap, for example.

In yet another aspect, a method for transporting a sheet-like substrate sheet through a coating installation using the transporting device includes introducing a material and a carrier gas into a first chamber including the transporting device, heating the material such that a portion of the material vaporizes into a vapor, directing a mixture of the vapor and carrier gas through a second chamber to form a substantially uniform vapor/carrier gas composition, directing the substantially uniform vapor/carrier gas composition toward a surface of a substrate having a temperature lower than the vapor. The shield or baffle is arranged proximate to a vapor distributor to capture stray flux.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
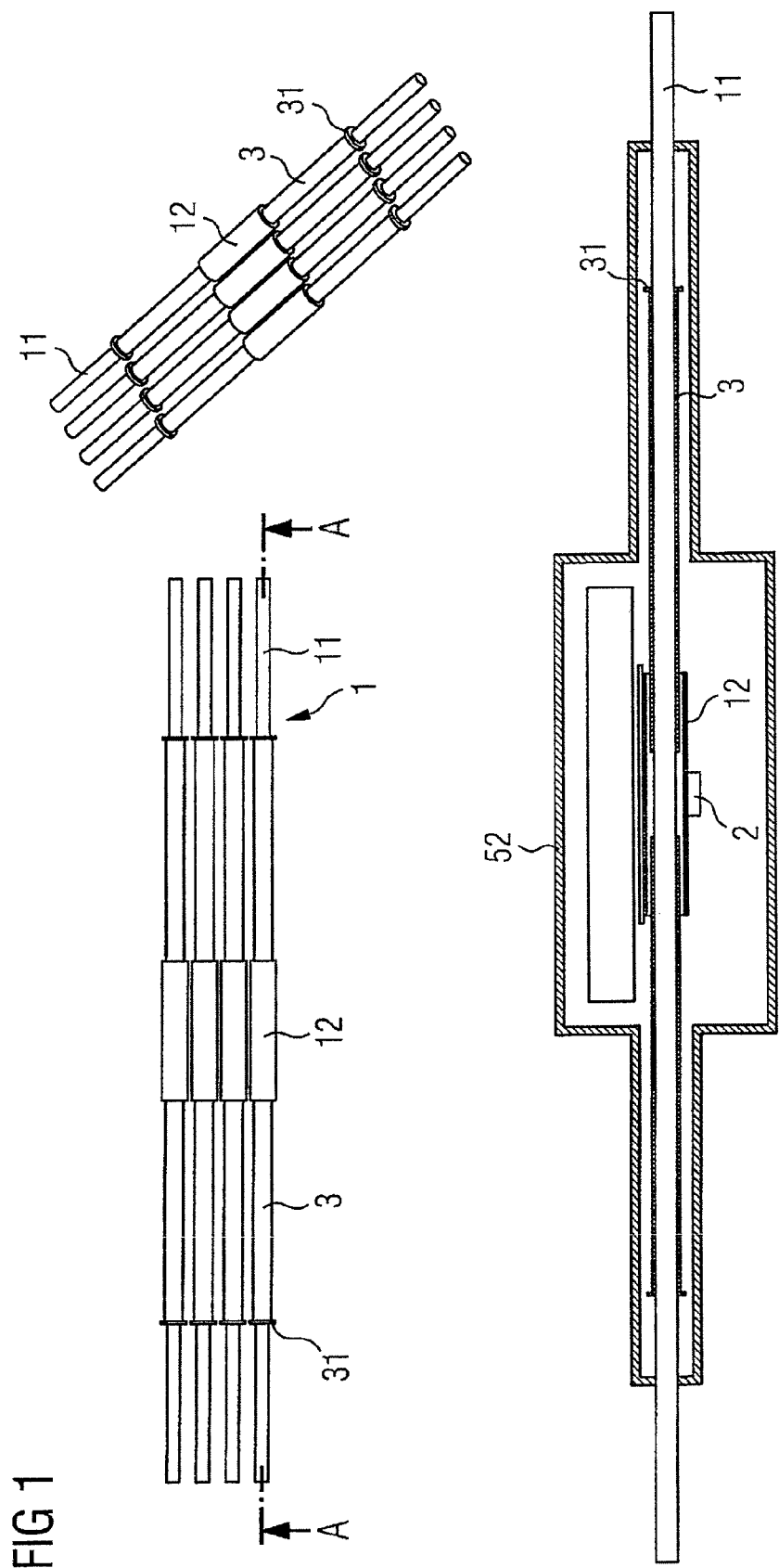
FIG. 1 shows an exemplary embodiment of the invention in several views.

A transporting roller or a plurality of transporting rollers are arranged transversely in relation to a transporting direction of sheet-like substrates and on which the substrates are transported through the coating installation, the transporting rollers rotating. The uppermost surface lines of the transporting rollers, i.e. the lines in which the substrates are in contact with the transporting rollers, define the transporting plane. In this case, some or all of the transporting rollers are driven by drive means provided for the purpose. Such transporting devices extend through the entire coating installation, i.e. both through those regions of the coating installation that serve for the coating of the substrates and through other regions that are necessary for the process, for example transfer chambers, evacuation chambers, etc.

To achieve a uniform coating rate over the width of the substrate, an overhang of the coating source beyond the width of the substrate is required on both sides. Typical overhangs are of the order of magnitude of 10% and more on each of both sides, the coating rate outside the substrate zone falling with increasing distance from the edge of the substrate, at first slightly and finally exponentially.

In particular at high coating rates, and especially whenever linear sources are concerned, as are typical for vaporizing processes, and after long process times, the regions of the transporting rollers lying outside the substrate region are coated if no countermeasures are taken.

The layers building up on the transporting rollers inside and outside the substrate region lead to uneven support of the substrates on the transporting rollers, so that in the end transporting problems occur. In particular at high coating rates, the transporting rollers must be cleaned after relatively short process times, which greatly restrict the availability of the installation, since cooling and vacuum and thermal conditioning take up considerable times.

Stationary baffles that keep the undesired layers of stray vapour away from the transporting rollers fail if the layers that have built up in the region of the edges of the substrate can, because of their thickness, partially block the vapour stream and consequently adversely influence the homogeneity of the layer thicknesses. This has the effect that the undesired layers of stray vapour must be continuously transported away, for instance by movable baffles, belts running next to the substrate or similar devices.

The object of the present invention is therefore to provide a transporting device of the type mentioned with which the intervals between necessary cleaning work on account of undesired vapour deposition on the transporting rollers are longer than in the case of conventional transporting devices.

The transporting device according to the invention, in particular for transporting sheet-like substrates through a coating installation, comprises transporting rollers which are rotatably mounted on both sides and horizontally arranged transversely in relation to the transporting direction, the uppermost surface lines of the transporting rollers defining the transporting plane, and is characterized in that the end parts of the transporting rollers have a smaller diameter than the middle part of the transporting rollers and in that baffles which are mounted displaceably in the axial direction of the transporting rollers between a first position and a second position are arranged between the end parts of the transporting rollers and the transporting plane.

The length of the middle part is in this case chosen such that it is less than the width of the substrates to be transported, so that the substrates protrude beyond the middle part of the transporting rollers. This prevents unwanted vapour from being deposited on the middle part. The end parts of the transporting rollers have a smaller diameter than the middle part and in this way create the installation space that is required to attach baffles which reach to below the edges of the substrate and guard the end parts of the transporting rollers against unwanted vapour deposition.

The fact that the baffles are mounted in an axially displaceable manner has the effect of considerably extending the cleaning intervals of the transporting device. At first the baffles are arranged in a first position, in which the end of the baffle lies underneath the substrate and, in the horizontal direction, as close as possible to the middle of the transporting roller. Vapour-depositing material that gets beyond the edge of the substrate hits the baffle.

During operation of the transporting device, the baffles are continuously displaced from the middle part to the ends of the transporting rollers. As a result, the increase in thickness of the layer produced on the baffles is limited, since the vapour keeps hitting new portions of the baffle. The second position of the baffle is reached shortly before the end of the baffle is drawn up under the substrate. Since, if the baffle were drawn out any further, vapour would be deposited on the end part of the transporting roller, the displacement of the baffle is stopped at this point and cleaning of the baffle is performed.

The baffle may be configured for example as a planar or curved metal sheet, but also as a hollow-cylindrical shielding sleeve, for example as a thin-walled tube.

In one refinement of the invention, rotatably mounted supporting rollers are provided underneath the transporting rollers, arranged in a parallel plane lying underneath the transporting plane.

The supporting rollers give the transporting rollers a third, central supporting region, which prevents unwanted deformation of the transporting rollers under the load of the substrate and so allow the use of transporting rollers with a relatively small diameter, whereby the transporting device has a low weight and can be produced at low cost.

In a further refinement of the invention, the middle part of the transporting rollers has at least one annular indentation, which is arranged in the end face and the outside diameter of which is less than the outside diameter of the middle part.

To make the cleaning interval as long as possible, the decisive factor is that the first and second positions of the baffles are as far apart from each other as possible, i.e. that the baffles can be displaced by an amount that is as long as possible. One possibility could be to make the middle part of the transporting rollers much shorter than the substrates are wide. However, this entails the risk of the substrates being deformed under the dead weight of their regions protruding beyond the middle part of the transporting rollers.

It is therefore advantageous to provide an annular indentation in the axial direction in the end face of the middle part of the transporting roller, i.e. between the circumferential surface of the end part and the circumferential surface of the middle part, with the effect that, when there is a slight overhang of the substrates beyond the middle part, it nevertheless allows the baffle to be slid relatively far under the substrate into the first position. A hollow-cylindrically formed baffle is especially suitable for this in particular. Therefore, hollow-cylindrically formed baffles represent a particularly advantageous refinement of the invention.

In a further refinement of the invention, the baffles are produced from flexible material. For example, the baffle may be formed as a flexible tube which can be compressed or extended in the longitudinal direction, in the case of which the axial displacement of the baffle substantially takes place by displacement of the end of the flexible tube that is under the substrate from a first position to a second position, so that new regions of the baffle are exposed to the vapour deposition.

In a further refinement of the invention, the inside diameter of the indentation corresponds substantially to the outside diameter of the end part of the transporting roller.

If the inside diameter of the indentation and the outside diameter of the end part of the transporting roller deviate significantly from each other, the insertion and displacement of the baffle in the indentation can lead to problems. It is therefore advantageous to produce a smooth transition from the circumferential surface of the end part to the inside diameter of the indentation.

To achieve this in a simple way, instead of producing the transporting roller from solid material on a lathe, the transporting roller according to the invention may also be produced from a shaft of constant diameter and a hollow-cylindrical transporting sleeve that is concentrically arranged, slipped over the shaft and preferably securely connected to the shaft in its middle region. In this case, the transporting sleeves form the middle part of the transporting rollers, while the free ends of the shaft represent the end parts of the transporting rollers.

In a further refinement of the invention, annular indentations are provided on both end faces of the middle part, their total depth being less than the length of the middle part.

This embodiment corresponds geometrically to the transporting roller explained above that is made up of a shaft and a hollow-cylindrical transporting sleeve. It is evident from this that the way in which the transporting rollers are produced has no influence on the functional capability of the invention. The advantage of this refinement is that baffles for which the first positions lie close together can be arranged on both sides, so that a great distance is available for the displacement of the baffles.

In a further refinement of the invention, at least one actuating device is also provided, for displacing the baffles.

The actuating device advantageously comprises at least one yoke, connected to at least one baffle, and at least one tie rod, connected to the yoke.

In a further refinement of the invention, a drive means is also provided, for driving the transporting rollers and/or for displacing the baffles.

Transporting devices for coating installations are usually provided in any case with a drive means for driving the transporting rollers. It is therefore particularly advantageous to use this drive means also for displacing the baffles.

The drive means is advantageously a geared motor. Geared motors are capable of accomplishing relatively low speeds of movement. In addition, it is possible to provide the geared motor with two outputs, which operate at different speeds. In this way, or else by interposing an additional gear mechanism, the displacement of the baffles can take place proportionally to the rotation of the transporting rollers, so that the baffles are only displaced when the transporting rollers rotate.

Referring to FIG. 1, an exemplary embodiment of the invention is represented in several views, in which embodiment the transporting device according to the invention comprises a number of transporting rollers, which are arranged in a horizontal plane transversely in relation to the transporting direction of the substrates in a coating installation.

The transporting device in the coating region is constructed substantially as follows. The vapour source is located over the substrate, transversely in relation to the transporting direction, from which source the vapour stream emerges in the direction of the substrate lying under it. To the left and right of the vapour source there are transporting rollers 1, which comprise a shaft 11 and a transporting sleeve 12. The diameter of the transporting sleeves 12 should be chosen to be as large as possible, for reasons still to be explained below. The transporting sleeves 12 have the form of tubes. Their length is slightly less than the width of the substrate, so that the substrates overhang on both sides of the transporting sleeves 12. This firstly ensures that the transporting sleeves 12 cannot be coated on their circumferential surfaces, apart from a slight coating of the transporting sleeves 12 on account of the unavoidable gaps in the case of coating individual substrates.

The transporting sleeves 12 are each driven by a concentric, water-cooled shaft 11 of small diameter. The water cooling may be omitted if the process temperature is so low that critical overheating of the components cannot occur. The shaft 11 has the function especially of driving the transporting sleeve 12. The mounting of the transporting shaft 1 takes place primarily by the supporting rollers 2 arranged under it. The supporting roller 2 may be omitted if the width of the substrate, and consequently the width of the shaft 11, is small and consequently mechanical support is not absolutely necessary.

The connection of the transporting sleeve 12 to the shaft 11 only takes place in the middle. On the shaft 11 there are movable baffles 3 on both sides in the form of hollow-cylindrical shielding sleeves, which respectively extend almost up to the middle in the transporting sleeve 12 and are dimensioned in their length in such a way that they enclose the shaft 11 up to the process chamber wall. The undesired stray vapour outside the substrate region is deposited on the movable baffles 3 primarily in the direct proximity of the transporting roller 1, whereby the diameter of the baffles 3 increases considerably, depending on the coating rate. Continuous or discontinuous drawing out of the movable baffles 3 on both sides allows the layers of stray vapour to be transported out from the coating region, so that the servicing intervals can be extended considerably.

The amount of condensed stray vapour that can be transported out from the coating zone depends on the diameter of the transporting sleeve 12, the diameter of the shaft 11 and the length of the baffle 3.

Further extension of the operating time is possible by replacing the coated baffle 3 with an uncoated one. The change can be made through a suitably formed vacuum lock, so that an interruption of the vacuum is not necessary.

Figure 2:
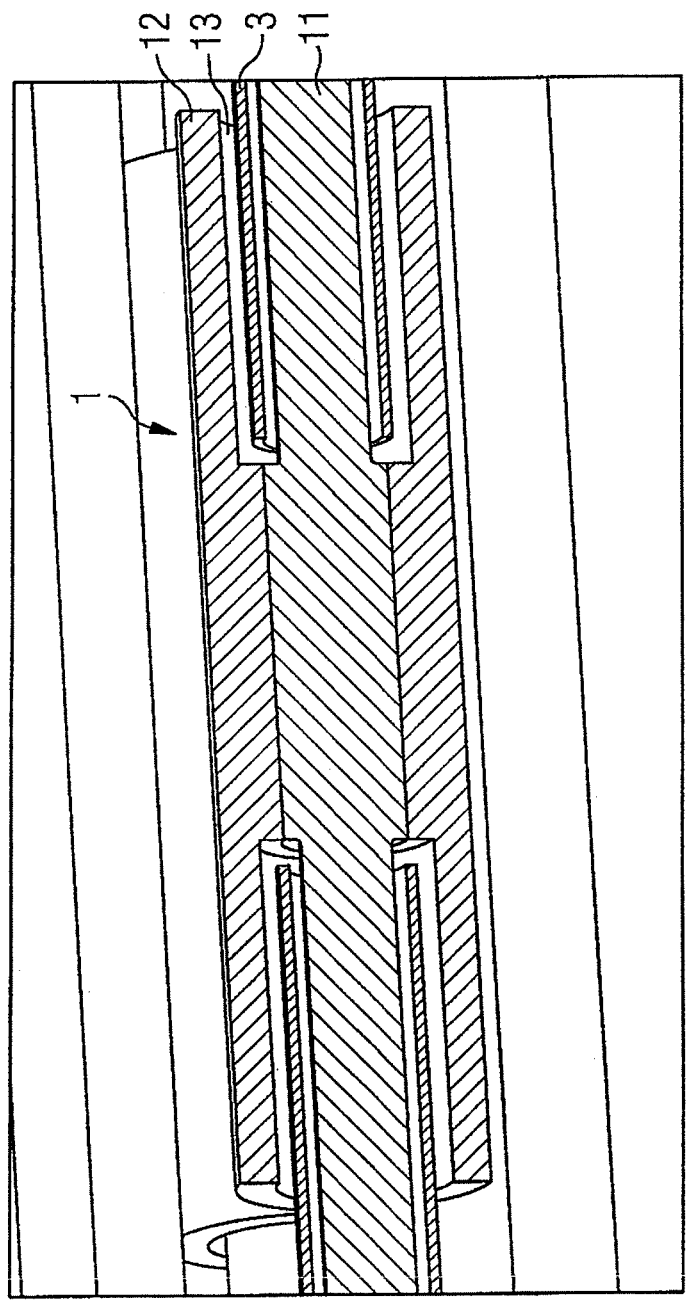
FIG. 2 shows a sectional representation of a transporting roller with two baffles and FIG. 3 shows a partial view of the transporting system according to the invention.

In FIG. 2, a transporting roller 1 of a transporting device arranged in a coating installation is represented in section. The transporting roller 1 comprises a shaft 11 and a transporting sleeve 12. The free ends of the shaft 11 form the end parts of the transporting roller 1. The transporting sleeve 12 is connected centrally and concentrically to the shaft 11 and forms the middle part of the transporting roller 1. On each of the two end faces, the transporting sleeve has an annular indentation 13, the inside diameter of which is, identical to the outside diameter of the shaft 11. A baffle 3 is pushed into each indentation 13 and located there in a first position.

During the operation of the transporting device, the transporting roller 1 rotates and in this way conveys the substrate, which rests on the transporting sleeve 12, through the coating installation. At the same time, the baffle 3 is slowly and continuously drawn out from the indentation 13, i.e. displaced in the axial direction of the transporting roller 1. The displacement is ended when the baffle 3 reaches its second position. In this second position, the end of the baffle 3 is still located underneath the substrate resting on the transporting sleeve 12, so that vapour is not deposited on the shaft 11.

Figure 3:
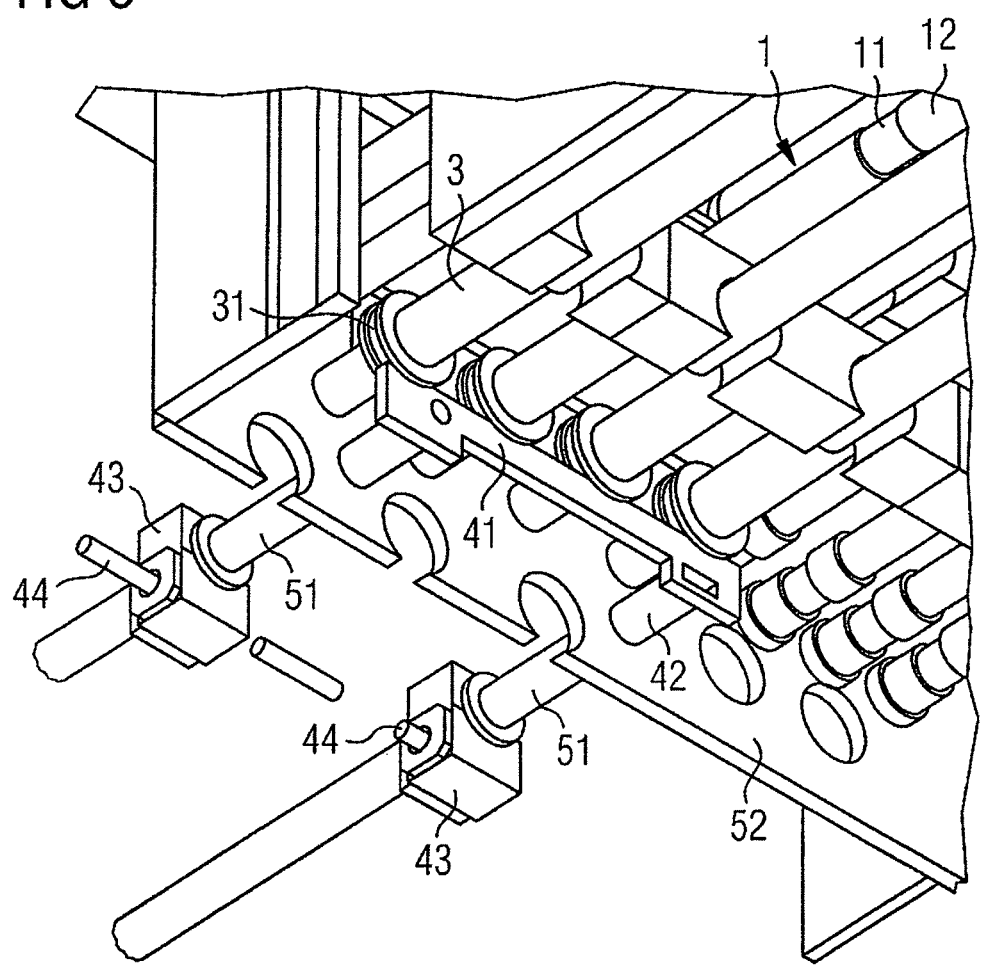

In FIG. 3, a number of transporting rollers 1 belonging to a transporting device arranged in a coating installation are represented.

The ends of the sleeves 3 facing away from the chamber wall of the coating installation have a double flange 31. Also provided is an actuating device, which has a yoke 41, two tie rods 42, two gear mechanisms 43 and a drive shaft 44. The yoke 41 engages in the double flanges 31 of four baffles 3. Two tie rods 42 are connected to the yoke 41 and each protrude into a guide sleeve 51, which is connected to the chamber wall 52 of the coating installation and widens the interior space of the coating installation, so that the tie rods 42 are disposed in the vacuum.

Arranged on the guide sleeves 51 are gear mechanisms 43, which are in operative connection with the tie rods 42 and are connected by a drive shaft 44 to one another and to a geared motor (not represented). As a result, a movement is transmitted from the geared motor via the drive shaft 44 to the gear mechanism 43, from the latter to the tie rods 42, the yoke 41 and finally from the yoke 41 to the baffles 3, so that the baffles 3 are displaced from their first position into their second position when the transporting device is in operation.

A method for transporting a sheet-like substrate sheet through a coating installation includes introducing a material and a carrier gas into a first chamber, heating the material such that a portion of the material vaporizes into a vapor, directing a mixture of the vapor and carrier gas through a second chamber to form a substantially uniform vapor/carrier gas composition, directing the substantially uniform vapor/carrier gas composition toward a surface of a substrate having a temperature lower than the vapor, such that the vapor condenses on the substrate as a film having substantially uniform thickness and crystallization, providing at least one roller to convey a sheet-like substrate along a transporting direction, providing at least one roller to have an end that has a smaller diameter than the middle of the roller, and arranging at least one shield proximate to a vapor distributor to capture stray flux.

For example, a method for transporting a sheet-like substrate can include introducing vapors of cadmium and tellurium into a contained environment and conveying a sheet-like substrate including a planar glass sheet heated to a temperature in the range of about 550 degrees to 640 degrees C. within the contained environment for continuous elevated temperature deposition of a layer of cadmium telluride onto one surface of the substrate to function as a semiconductor for absorbing solar energy. The sheet-like substrate can be oriented horizontally within the contained environment with the one surface of the substrate facing upwardly for the deposition of the cadmium telluride thereon and with the other surface of the substrate facing downwardly and being supported within the periphery thereof for horizontal conveyance while maintaining the planarity of the glass sheet.

Continuous processing of thin films onto glass sheet substrates is disclosed by U.S. Pat. No. 5,248,349, U.S. Pat. No. 5,372,646, U.S. Pat. No. 5,470,397, and U.S. Pat. No. 5,536,333. The vapor deposition utilized to provide the continuous coating can be performed within an oven that defines a heated chamber and that is located within an enclosure. A roll conveyor can include rolls that extend through the oven to support a glass sheet substrate on which the coating is performed and a drive mechanism located internally of the enclosure but externally of the oven drives the ends of the conveyor rolls which project outwardly from the oven. Also, U.S. Pat. No. 5,945,163, U.S. Pat. No. 6,037,241, and U.S. Pat. No. 6,719,848 disclose an apparatus and method for performing chemical vapor deposition wherein the gaseous material to be deposited is passed through a heated permeable membrane from a material supply for deposition on the substrate.

A number of embodiments of the invention have been described. Nevertheless, it will be understood that various modifications may be made without departing from the spirit and scope of the invention. Accordingly, other embodiments are within the scope of the following claims.

LIST OF REFERENCE NUMERALS 1 transporting roller
11 shaft
12 transporting sleeve
13 indentation
2 supporting roller
3 baffle
31 double flange
41 yoke
42 tie rod
43 gear mechanism
44 drive shaft
51 guide sleeve
52 chamber wall

The invention claimed is:

1. A method of transporting sheet-like substrates through a coating installation comprising:
rotating a rotatable shaft, wherein the rotatable shaft rotates a transporting sleeve;
moving a first baffle longitudinally along the rotatable shaft, wherein the first baffle is sized to fit partially within a first indentation formed on a first end of the transporting sleeve; and
moving a second baffle longitudinally along the rotatable shaft, wherein the second baffle is configured to fit partially within a second indentation formed on a second end of the transporting sleeve.

2. A transport device for transporting sheet-like substrates through a coating installation comprising:
a rotatable shaft with a longitudinal axis;
a transporting sleeve configured to rotate with the rotatable shaft;
a first indentation formed on a first end of the transporting sleeve;
a second indentation formed on a second end of the transporting sleeve;
a first baffle, axially movable along the rotatable shaft, sized to fit about the rotatable shaft and within the first indentation; and
a second baffle, axially movable along the rotatable shaft, sized to fit about the rotatable shaft and within the second indentation.

3. The transport device of claim 2, further comprising a mechanism for moving the first and second baffles along the longitudinal axis.

4. The transport device of claim 2, further comprising a rotatable supporting roller configured to support the rotatable shaft.

5. The transport device of claim 2, wherein the inside diameter of the first indentation corresponds substantially to the outside diameter of the rotatable shaft.

6. The transport device of claim 2, wherein the first and second baffles are formed from flexible material.

7. The transport device of claim 3, wherein the mechanism for moving the first and second baffles along the longitudinal axis comprises a first yoke connected to the first baffle and a first tie rod connected to the first yoke.

8. The transport device of claim 2, further comprising a drive structure means configured to rotate the rotatable shaft.

9. The transport device of claim 8, wherein the drive structure means is a geared motor.

10. The transport device of claim 3, wherein the mechanism for moving the first and second baffles is configured to displace the first and second baffles proportional to the rotation of the rotatable shaft.

11. The transport device of claim 2, wherein the transporting sleeve comprises an axial length, wherein the axial length is less than a width of a transported substrate.

12. The transport device of claim 7, wherein the first baffle comprises a first flange and the first yoke is configured to engage the first flange.

13. The transport device of claim 12, wherein the tie rod is connected to a drive mechanism.

14. The transport device of claim 2, wherein the shaft is water-cooled.

15. The transport device of claim 8, wherein the drive structure means is configured to displace the first and second baffles.

16. The transport device of claim 8, further comprising a second drive structure means configured to displace the first and second baffles.

17. The transport device of claim 2, wherein the rotatable shaft comprises an outer diameter and the transporting sleeve comprises a first inner diameter and a second inner diameter, wherein the first inner diameter is substantially the same as the outer diameter and the second inner diameter is substantially greater than the outer diameter.

18. The transport device of claim 2, wherein the transport device is configured to operate in a substantial vacuum and at temperatures in the range of 550° C. to 640° C.

19. The transport device of claim 2, wherein a transported substrate is configured to be provided between the transporting sleeve and a vapour source.

20. The transport device of claim 2, further comprising:
a plurality of rotatable shafts, each with a respective longitudinal axis;
a plurality of transporting sleeves, each configured to rotate with a respective rotatable shaft;
a first indentation formed on a first end of each transporting sleeve;
a second indentation formed on a second end of each transporting sleeve; and
a first baffle and second baffle provided on each rotatable shaft of the plurality of rotatable shafts, axially movable along the respective rotatable shaft, sized to fit about the respective rotatable shaft, wherein each first baffle is sized to fit within a respective first indentation and each second baffle is sized to fit within a respective second indentation.

* * * * *